United States Patent [19]
Chuang

[11] Patent Number: 6,045,866
[45] Date of Patent: Apr. 4, 2000

[54] METHOD OF FORMING ELECTROLESS METAL PLATING LAYERS ON ONE SINGLE SURFACE OF A PLASTIC SUBSTRATE AND THE PRODUCT THEREOF

[75] Inventor: Ho-chih Chuang, Taoyuan Hsien, Taiwan

[73] Assignee: Jin Yee Enterprise Co., Ltd., Taiwan

[21] Appl. No.: 09/135,672

[22] Filed: Aug. 18, 1998

[51] Int. Cl.[7] ............................................ B05D 3/04
[52] U.S. Cl. ...................... 427/304; 427/305; 427/306; 427/307; 427/405; 427/443.1; 427/98; 427/282
[58] Field of Search ............................. 427/98, 304–307, 427/282, 405, 443.1

[56] References Cited

U.S. PATENT DOCUMENTS

| | | | |
|---|---|---|---|
| 4,514,586 | 4/1985 | Waggoner | 427/264 |
| 5,049,230 | 9/1991 | Patel et al. | 427/307 |
| 5,498,440 | 3/1996 | Chao | 427/304 |

*Primary Examiner*—Brian K. Talbot
*Attorney, Agent, or Firm*—Smith, Gambrell & Russell, LLP

[57] ABSTRACT

Disclosed is a method of forming electroless metal plating layers on one single surface of a plastic substrate and the product thereof. The method includes steps of degreasing or pre-etching the material for forming the substrate, etching the material, adding catalysis, activating, drying, spraying non-conducting paint on a first surface of the material, accelerating, forming an electroless copper plating layer on a second surface of the material, activating, forming an electroless nickel plating layer on the second surface of the material, sealing, dehydrating, drying, inspecting, and packing. Wherein, the steps of spraying non-conducting paint and drying give the material a beautiful painted appearance on the first surface thereof. The non-conducting paint on the first surface of the material facilitates easy formation of smooth electroless copper and nickel plating layers on the second surface of the material. Therefore, a product of the method can be used in electronic products requiring high sensitivity.

2 Claims, 1 Drawing Sheet

METHOD OF FORMING ELECTROLESS METAL PLATING LAYERS ON ONE SINGLE SURFACE OF A PLASTIC SUBSTRATE AND THE PRODUCT THEREOF

FIELD OF THE INVENTION

The present invention relates to a method of forming electroless metal plating layers on one single surface of a substrate and the product thereof, and more particularly to a single-surface electroless-plating method and the product thereof that does not have the drawbacks found in the conventional single-surface and double-surface electroless-plating methods while possess the advantages of the two conventional electroless-plating methods to allow easy electroless-plating on one single surface of a plastic substrate.

BACKGROUND OF THE INVENTION

To form an electromagnetic-wave-interference preventive layer on a non-conducting and insulating material, such as plastics, ceramics or glass, there are two conventional methods, namely, double-surface electroless-plating and single-surface electroless-plating methods.

There are total thirteen (13) steps included in the process of the conventional double-surface electroless-plating method: 1) Degreasing or pre-etching the material, 2) Etching the material, 3) Adding catalyst, 4) Activating, 5) Accelerating, 6) Electroless copper plating, 7) Activating, 8) Electroless nickel plating, 9) Sealing, 10) Dehydrating, 11) Drying, 12) Inspecting, and 13) Packing. FIG. 1 illustrates the manner in which a substrate 5 is formed on two contact surfaces with electromagnetic-wave-interference preventive layers. First, the two surfaces are respectively plated with one layer of copper 1. Then, the resultant secondary contact surfaces are respectively plated with one layer of nickel 2. Finally, the outmost surfaces of the substrate 5 are painted to form paint layers 3.

There are also thirteen steps included in the process of the conventional single-surface electroless-plating method: Spraying catalytic paint which comprises mixed metal powder of Ag, Fe and Ni blended with resin; Drying; Hydrophilic treatment; Electroless copper plating; Activating; Electroless nickel plating; Sealing; Dehydrating; Drying; Inspecting; and Packing. FIG. 2 illustrates the manner in which a substrate 5 is formed on one contact surface with electromagnetic-wave-interference preventive layers. First, the contact surface that is to be plated is sprayed with a layer of catalytic paint 4. Then, the painted surface is sequentially plated with a layer of copper 1 and a layer of nickel 2. Finally, the other contact surface of the substrate 5 that is not be plated is painted to form a paint layer 3 depending on actual need.

The above-mentioned conventional double-surface electroless-plating method can be used in double-surface plating but not in single-surface plating. With the double-surface plating, the copper and nickel plating layers can not be removed from the substrate and will cause problems in the recycling of the substrate and the environment protection. Moreover, the paint layer tends to peel off from the substrate. An advantage of the conventional double-surface electroless-plating method is low processing cost thereof.

In the above-mentioned conventional single-surface electroless-plating method, the use of catalytic paint causes coarse surfaces of the copper and nickel layers plated on the catalytic paint layer 4. If a substrate having one surface plated with this method is used to form an electronic component, the plated coarse surface contacted with an electronic element will frequently scrape off the conductive material over the contacted electronic element and causes failure of the element. Therefore, the substrate processed with the conventional single-surface electroless-plating method can not be used in electronic products in which high-sensitivity is a prerequisite. That is, substrates processed with the conventional single-surface electroless-plating method have only limited usage. Moreover, to allow such single-surface plating, a mold having cavity identical to the substrate to be plated must be cut. The mold holds the surface of the substrate that is not to be plated in order to isolate that surface from external environment. It costs very high to cut a mold that is to be absolutely identical to the substrate 5 to completely shield the surface that is not to be plated. And, no matter how the mold is precisely cut, the catalytic paint provided on the opposite surface to be plating will still inevitably overflow from the substrate and smear the surface not to be plated via a play between the mold and the substrate formed for convenient placement and removal of the substrate into and from the mold. It requires high labor cost to clean the smeared surface not to be plated and a very high bad yield of the finished substrate exists. And, the high bad yield will adversely affect the timely delivery of the finished products. The only advantage of the conventional single-surface electroless-plating method is that it allows plating on one single surface of the substrate.

SUMMARY OF THE INVENTION

It is therefore a primary object of the present invention to provide an improved method for forming electroless metal plating layers on one single surface of a plastic substrate, wherein the other surface of the plastic substrate that is not to be plated is treated and painted to form an absolutely insulating paint layer thereon. The paint layer is then dried to provide an excellent isolating effect to positively prevent that surface of the plastic substrate from being plated.

Another object of the present invention is to provide the above method for forming electroless metal plating layers on one single surface of a plastic substrate, wherein no catalytic paint is used in the method and therefore smooth copper or nickel plating layer can be formed on the substrate. Products made through this method can therefore be used in electronic products requiring high sensitivity.

BRIEF DESCRIPTION OF THE DRAWINGS

The above and other objects as well as the structural and functional features of the present invention can be best understood by referring to the following detailed description of the preferred embodiments and the accompanying drawings, wherein.

DETAILED DESCRIPTION OF THE PREFERRED EMBODIMENTS

The present invention provides an improved method for forming electroless metal plating layers on one single surface of a plastic substrate. In this method, following sixteen steps are included:
1. Degreasing or pre-etching the substrate;
2. Etching the substrate;
3. Adding catalysis;
4. Activating;
4a. Drying the substrate;
4b. Spraying non-conducting paint over the substrate;
4c. Drying the substrate again;
5. Accelerating;
6. Electroless-plating to form a layer of copper plating;
7. Activating;
8. Electroless-plating to form a layer of nickel plating;
9. Sealing;
10. Dehydrating the substrate;
11. Drying the substrate;
12. Inspecting the substrate; and
13. Packing the substrate.

Figure 1:
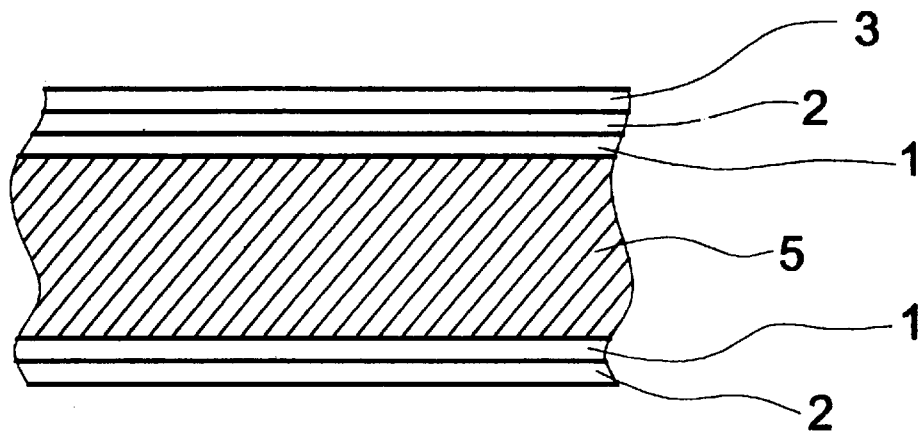
FIG. 1 illustrates the structure of a substrate having two surfaces plated through the conventional double-surface electroless-plating method.
Figure 2:
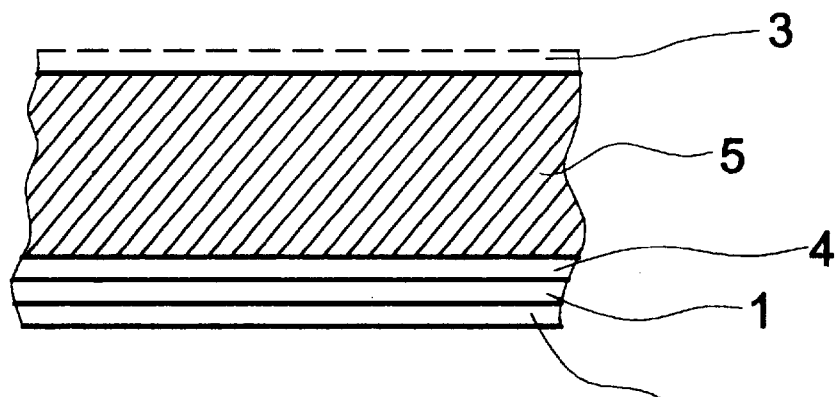
FIG. 2 illustrates the structure of a substrate having one single surface plated through the conventional single-surface electroless-plating method.
Figure 3:
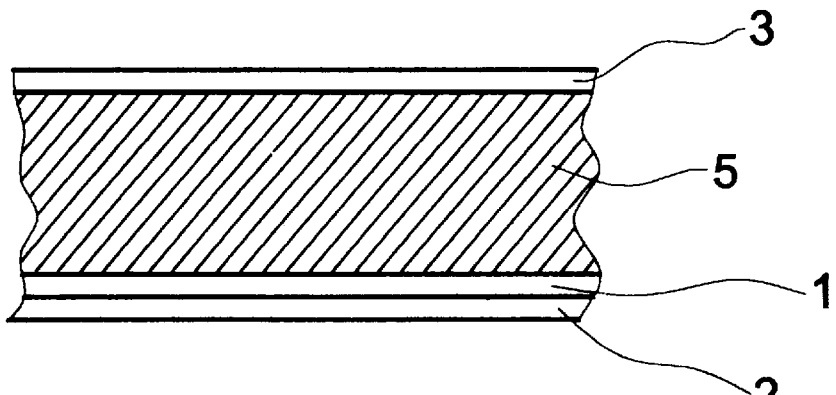
FIG. 3 illustrates the structure of a substrate having one single surface plated through the single-surface electroless-plating method according to the present invention.

Please refer to FIG. 3. After the first four steps of the method of the present invention have been completed on a substrate 5, the substrate 5 is dried, sprayed with non-conducting paint, and dried again as described in the above step Nos. 4a, 4b, and 4c, so that a layer of non-conducting paint 3 is formed on a first surface of the substrate 5 that is not to be plated. The purpose of the paint layer 3 is on the one hand to provide a beautiful finish of the substrate 5, and on the other hand to provide an insulating effect so that the first surface of the substrate 5 with the non-conducting paint layer 3 is completely not affected by the subsequent electroless-plating process, allowing the substrate 5 to be easily plated only on a second surface that is opposite to the first surface and not covered by the paint. Thereafter, step Nos. 5 to 13 are proceeded. Due to the non-conductive paint layer 3 on the first surface of the substrate 5, only the second surface of the substrate 5 is sequentially plated to form electromagnetic-wave-interference preventive layers of copper plating 1 and nickel plating 2. Therefore, the insulating paint layer 3 also has the function of permitting only one single surface of the substrate without the paint to be easily plated. The electroless copper and nickel plating layers 1 and 2 formed through the method of the present invention have smooth surfaces comparing with the coarse surfaces of the copper and nickel plating layers formed through the conventional single-surface electroless-plating method. Therefore, a plastic substrate 5 can be single-surface plated at reduced cost through the method of the present invention while it has smooth finish and can be used on electronic products requiring high sensitivity.

Moreover, the copper and nickel plating layers 1 and 2 formed on the second surface of the substrate 5 through the method of the present invention can be removed and the substrate 5 can therefore be recycled. Comparing with the conventional double-surface electroless-plating method, the method of the present invention is environment-friendly.

The material of the substrate 5 may be selected from the group of ABS, ABS+Polycarbonate (PC), or PC+fiber glass. In the case of ABS, degreasing of the material in the first step is a must. And, in the case of ABS+PC or PC+fiber glass, the pre-etching of the material in the first step is a must.

Following is a table comparing the method of the present invention with the conventional single- and double-surface electroless-plating methods:

| Compared Items | Method of the Present Invention | Conventional Single-surface | Conventional Double-surface |
| --- | --- | --- | --- |
| Catalytic paint | Not required | Required and Relying on import | Not required |
| Paint & finish | Easy | Not easy | Easy |
| Molds and cost | Low | High | Low |
| Dirty due to Remover for male Mold of substrate | Does not matter | Having influence On the attachment Of catalytic paint | Does not matter |
| Remedy for Substrate surface | Possible | Impossible | Possible |
| Forming of Finished product And machinability | Easy | Difficult | Easy |
| Appearance | Enhanced by outer Paint | Enhanced by outer Paint but with Increased cost | Enhanced by outer Paint |
| Peeling of paint | Not found | Not found | Possible because The paint is Sprayed on plating |
| Etching | Depends | Required | Depends |
| Environmental Protection | Recycling of Substrate w/paint Is possible after Removal of plating | Recycling of Substrate w/metal Powder & resin is Impossible after Removal of plating | Recycling of Substrate w/paint Is impossible Because plating Is not removable |
| Plated surface | Smooth w/shimmer, Suitable for assembly | Coarse & dull, Tending to be Scrapped off | Smooth w/shimmer, Suitable for assembly |
| Bad yield | Low | High | Low |
| Rework | Possible | Impossible | Possible |
| Time for forming Copper plating | Short | Long | Short |
| Size of copper Tank (the same as The thickness of Copper plating) | Small | Very large | Small |

-continued

| Compared Items | Method of the Present Invention | Conventional Single-surface | Conventional Double-surface |
| --- | --- | --- | --- |
| Treatment of Waste copper fluid | Easy | Difficult due to Bulky volume | Easy |
| Electrical Conduction | Good | Normal | Good |
| Bonding strength | Good mechanical And chemical Bonding | Less bonding Strength due to Metal powder | Good mechanical And chemical Bonding |
| Cost | Low | High | Medium |

From the comparison, it can be found that the method of the present invention is a best method for forming electroless plating layers on one single surface of a plastic substrate for use in electronic components because it eliminates the drawbacks existing in the conventional single- and double-surface electroless-plating methods while it possesses the advantages of the two conventional methods.

The present invention also relates to a product of single-surface-plated plastic substrate produced according to the method of the present invention. Such product of plastic substrate has one smooth copper and nickel plated surface and another painted insulated surface. The smooth plated surface of the substrate allows the substrate to be used in electronic component requiring high sensitivity to increase the value of the electronic product.

What is to be noted is the present invention is shown and disclosed in the form of a preferred embodiment thereof and that various changes in the shape, size, and arrangements of parts may be resorted to without departing from the spirit of the invention or the scope of the subjoined claims.

What is claimed is:

1. A method of forming electroless metal plating layers on one single surface of a plastic substrate having a first contact surface and a second contact surface, said method comprising:

a. degreasing or pre-etching a material for forming said plastic substrate;
   b. etching said substrate having been degreased or pre-etched to produce an etched substrate;
   c. adding a catalyst;
   d. activating said etched substrate to form an activated substrate;
   e. accelerating;
   f. forming an electroless copper plating layer on a second contact surface of said substrate;
   g. activating said substrate again;
   h. forming an electroless nickel plating layer on said copper plating layer of said substrate;
   i. sealing said plated substrate to form a sealed substrate;
   j. dehydrating said sealed substrate;
   k. drying said substrate again;
   l. inspecting said substrate; and
   m. packing said plastic substrate;

wherein said method is characterized in that additional steps are incorporated between the above step d and step e, said additional steps comprising drying said activated substrate, spraying non-conducting paint over a first contact surface of said substrate, and drying said substrate again, whereby said electroless copper and nickel plating layers formed on said second contact surface of said substrate serve to prevent electromagnet wave interference while said non-conducting paint on said first contact surface of said substrate prevents said second contact surface of said substrate from being plated.

2. A method of forming electroless metal plating layers on one single surface of a plastic substrate as claimed in claim 1, wherein said material for forming said substrate is selected from the group consisting of ABS, ABS+polycarbonate, and polycarbonate+fiber glass.

* * * * *